US012751034B2

(12) United States Patent
Reese et al.

(10) Patent No.: US 12,751,034 B2
(45) Date of Patent: Sep. 29, 2026

(54) DUAL-GATE SEMICONDUCTOR STRUCTURES FOR POWER APPLICATIONS

(71) Applicant: Qorvo US, Inc., Greensboro, NC (US)

(72) Inventors: Elias Reese, Dallas, TX (US); Amin Shahverdi, Murphy, TX (US); Nikolaus Klemmer, Dallas, TX (US)

(73) Assignee: Qorvo US, Inc., Greensboro, NC (US)

( * ) Notice: Subject to any disclaimer, the term of this patent is extended or adjusted under 35 U.S.C. 154(b) by 278 days.

(21) Appl. No.: 18/400,377

(22) Filed: Dec. 29, 2023

(65) Prior Publication Data

US 2024/0243197 A1 Jul. 18, 2024

Related U.S. Application Data

(60) Provisional application No. 63/539,384, filed on Sep. 20, 2023, provisional application No. 63/513,974, (Continued)

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 62/8503* (2025.01);
(Continued)

(58) Field of Classification Search
CPC .. H10D 30/015; H10D 64/256; H10D 30/475; H10D 30/4755
See application file for complete search history.

(56) References Cited

U.S. PATENT DOCUMENTS

| | | | |
|---|---|---|---|
| 4,048,646 A | 9/1977 | Ogawa et al. | |
| 5,925,900 A | 7/1999 | Amaratunga et al. | |

(Continued)

FOREIGN PATENT DOCUMENTS

| | | | |
|---|---|---|---|
| CN | 115865002 A | 3/2023 | |
| EP | 4135051 A1 | 2/2023 | |
| WO | 2022118445 A1 | 6/2022 | |

OTHER PUBLICATIONS

Pengelly, R. et al., "A Review of GaN on SiC High Electron-Mobility Power Transitors and MMICs," IEEE Transactions on Microwave Theory and Techniques, vol. 60, No. 6, Jun. 2012, IEEE, pp. 1764-1783.

(Continued)

*Primary Examiner* — Antonio B Crite
(74) *Attorney, Agent, or Firm* — Withrow & Terranova, P.L.L.C.

(57) ABSTRACT

This disclosure relates to a semiconductor structure and a method for fabrication of semiconductor structures, wherein the semiconductor structure is a quasi-dual-gate field-effect transistor structure having a floating ohmic contact and a field plate. The disclosed semiconductor structure comprises a substrate, a body region over the substrate having a top surface, a source ohmic contact, a drain ohmic contact, and a floating ohmic contact disposed between the source ohmic contact and the drain ohmic contact. The disclosed semiconductor structure further comprises a first dielectric layer disposed over an outermost surface of the body region, and a first gate electrode and a second gate electrode deposited in and around openings in the first dielectric layer and over opposite sides of the floating ohmic contact.

22 Claims, 13 Drawing Sheets

Related U.S. Application Data filed on Jul. 17, 2023, provisional application No. 63/511,352, filed on Jun. 30, 2023, provisional application No. 63/502,268, filed on May 15, 2023, provisional application No. 63/479,788, filed on Jan. 13, 2023, provisional application No. 63/479,787, filed on Jan. 13, 2023, provisional application No. 63/479,790, filed on Jan. 13, 2023.

(51) Int. Cl.

| | |
|---|---|
| ***H10D 62/17*** | (2025.01) |
| ***H10D 62/85*** | (2025.01) |
| ***H10D 64/00*** | (2025.01) |
| ***H10D 64/01*** | (2025.01) |
| ***H10D 64/23*** | (2025.01) |
| ***H10D 64/27*** | (2025.01) |
| ***H10W 74/10*** | (2026.01) |

(52) U.S. Cl.

CPC ........... *H10D 64/01* (2025.01); *H10D 64/111* (2025.01); *H10D 64/411* (2025.01); *H10W 74/137* (2026.01); *H10W 74/147* (2026.01)

(56) References Cited

U.S. PATENT DOCUMENTS

| | | | | |
|---|---|---|---|---|
| 6,724,043 | B1 | 4/2004 | Ekkanath Madathil | |
| 9,647,611 | B1 | 5/2017 | Embar et al. | |
| 9,831,857 | B2 | 11/2017 | Facchini et al. | |
| 9,923,523 | B2 | 3/2018 | Lehtola | |
| 9,948,252 | B1 | 4/2018 | Adamski | |
| 9,966,903 | B1 | 5/2018 | McLaren et al. | |
| 10,411,653 | B2 | 9/2019 | Takenaka | |
| 11,128,266 | B1 | 9/2021 | Fraser et al. | |
| 2003/0011436 | A1 | 1/2003 | Shigematsu | |
| 2007/0046379 | A1 | 3/2007 | Tanahashi et al. | |
| 2008/0204146 | A1 | 8/2008 | Bouny | |
| 2009/0065810 | A1 | 3/2009 | Honea et al. | |
| 2009/0206926 | A1 | 8/2009 | Horiguchi et al. | |
| 2010/0316164 | A1 | 12/2010 | Liang et al. | |
| 2011/0204807 | A1 | 8/2011 | Hashizume et al. | |
| 2012/0032743 | A1 | 2/2012 | Hsieh et al. | |
| 2012/0235734 | A1 | 9/2012 | Pengelly | |
| 2013/0082782 | A1 | 4/2013 | Leuschner et al. | |
| 2014/0125416 | A1 | 5/2014 | Widdowson et al. | |
| 2014/0306761 | A1 | 10/2014 | Fujiwara et al. | |
| 2015/0123168 | A1 | 5/2015 | Green et al. | |
| 2015/0228646 | A1 | 8/2015 | Ho et al. | |
| 2017/0301781 | A1 | 10/2017 | Boles et al. | |
| 2018/0191309 | A1 | 7/2018 | McLaren | |
| 2019/0081599 | A1 | 3/2019 | Takenaka | |
| 2020/0313624 | A1 | 10/2020 | Mokhti et al. | |
| 2020/0313626 | A1 | 10/2020 | Ding | |
| 2020/0373297 | A1* | 11/2020 | Nidhi ................. | H10D 62/8503 |
| 2021/0013838 | A1 | 1/2021 | Wang et al. | |
| 2021/0050820 | A1 | 2/2021 | Khalil et al. | |
| 2022/0294395 | A1 | 9/2022 | Tanaka et al. | |
| 2023/0299721 | A1 | 9/2023 | Sasaki | |

OTHER PUBLICATIONS

Extended European Search Report for European Patent Application No. 24151253.2, mailed Jun. 4, 2024, 9 pages.

Extended European Search Report for European Patent Application No. 24151466.0, mailed Jun. 26, 2024, 12 pages.

Partial European Search Report for European Patent Application No. 24151011.4, mailed Jun. 26, 2024, 14 pages.

Extended European Search Report for European Patent Application No. 24150768.0, mailed Jun. 10, 2024, 12 pages.

Extended European Search Report for European Patent Application No. 24151011.4, mailed Oct. 16, 2024, 14 pages.

Fanning, D. et al., "Dielectrically defined optical T-gate for high power GaAs pHEMTs," International Conference on Compound Semiconductor MANufacturing TECHnology (GaAs MANTECH 2002, Apr. 8-11, 2002, San Diego, CA, USA, GaAS MANTECH Inc., 4 pages.

* cited by examiner

DUAL-GATE SEMICONDUCTOR STRUCTURES FOR POWER APPLICATIONS

RELATED APPLICATIONS

This application claims the benefit of provisional patent application Ser. No. 63/502,268, filed May 15, 2023, and provisional patent application Ser. No. 63/479,790, filed Jan. 13, 2023, the disclosures of which are hereby incorporated herein by reference in their entireties.

This application claims the benefit of provisional patent application Ser. No. 63/539,384, filed Sep. 20, 2023, and claims the benefit of provisional patent application Ser. No. 63/513,974, filed Jul. 17, 2023, and claims the benefit of provisional patent application Ser. No. 63/511,352, filed Jun. 30, 2023, and claims the benefit of provisional patent application Ser. No. 63/479,788, filed Jan. 13, 2023, and claims priority to provisional patent application Ser. No. 63/479,787, filed Jan. 13, 2023, the disclosures of which are hereby incorporated herein by reference in their entireties.

FIELD OF THE DISCLOSURE

The present disclosure relates generally to semiconductor devices and more particularly to semiconductor devices configured for power applications.

BACKGROUND

A conventional cascade structure commonly implemented using two transistor stages is a well-established circuit that enables improvement in several performance characteristics, notably gain and voltage handling. Nonetheless, fabrication and manufacturing of a conventional cascade structure is adversely affected by a large die area necessary for its implementation. In this regard, the cascade function may be implemented using a single stage (i.e., a dual-gate field-effect transistor [FET] structure.) However, dual-gate FET structures are bounded by operational limits. Increasing a distance between a first gate and a second gate of a dual-gate FET structure adversely affects the device performance by increasing access resistance within the channel layer and in between conductive channels formed under the first gate and the second gate.

Therefore, there is a need for a structure with improved manufacturability, electric field management, and thermal management.

SUMMARY

The present disclosure relates generally to semiconductor devices and more particularly to semiconductor devices configured for power applications. In one aspect, the disclosed semiconductor structure comprises a substrate, a body region over the substrate and comprising a top surface, a source ohmic contact disposed over a first portion of the top surface and extending into the body region from the top surface, a drain ohmic contact disposed over a second portion of the top surface and extending into the body region from the top surface, a floating ohmic contact disposed over a third portion of the top surface between the source ohmic contact and the drain ohmic contact, and extending into the body region from the top surface. The semiconductor structure further comprises a first dielectric layer disposed over an outermost surface of body region, and a first gate electrode and a second gate electrode deposited in and around a first opening and a second opening, respectively, in the first dielectric layer over the top surface of the body region and over opposite sides of the floating ohmic contact.

In an embodiment, the floating ohmic contact is configured to provide a low resistive path between a first channel formed under the first gate electrode and a second channel formed under the second gate electrode.

In an embodiment, the semiconductor structure further comprises a second dielectric layer disposed over exposed portions of a top surface the first dielectric layer and covering surfaces of the first gate electrode and the second gate electrode.

In another embodiment, the semiconductor structure further comprises a field plate coupled to the source ohmic contact and extending over the second dielectric layer covering at least the first gate electrode and the second gate electrode. In the same embodiment, the semiconductor structure further comprises a source electrode disposed in and around an opening in the first dielectric layer and the second dielectric layer over a portion of a top surface of the source ohmic contact, and a drain electrode disposed in and around an opening in the first dielectric layer and the second dielectric layer over a portion of a top surface of the drain ohmic contact, wherein the field plate couples to the source ohmic contact via the source electrode.

In another embodiment, the semiconductor structure further comprises a source electrode disposed in and around an opening in the first dielectric layer and the second dielectric layer over a portion of a top surface of the source ohmic contact, and a drain electrode disposed in and around an opening in the first dielectric layer and the second dielectric layer over a portion of a top surface of the drain ohmic contact.

According to an embodiment, the semiconductor structure comprises a third dielectric layer disposed over a top surface the second dielectric layer and at least partially over the source electrode and the drain electrode.

In an embodiment, the semiconductor structure comprises a field plate coupled to the source electrode through an opening in the third dielectric layer over a top surface of the source electrode and extending over the third dielectric layer covering at least the first gate electrode and the second gate electrode.

In an embodiment, each of the source ohmic contact, the drain ohmic contact, and the floating ohmic contact comprise one of titanium, aluminum, nickel, gold, or their composition.

In an embodiment, a thickness of the floating ohmic contact is in the range of 50 nm to 300 nm.

In an embodiment, a width of the floating ohmic contact is in the range of 1 μm to 12 μm.

In an embodiment, a distance between a central point of the first gate electrode over the top surface and a central point of the second gate electrode over the top surface is in the range of 2 μm to 15 μm.

In an embodiment, a distance between a central point of the first gate electrode over the top surface to a closer outer boundary of the floating ohmic contact that meets the top surface is in the range of 0.2 μm to 5 μm.

In an embodiment, a distance between a central point of the second gate electrode over the top surface to a closer outer boundary of the floating ohmic contact that meets the top surface is in the range of 0.2 μm to 5 μm.

In an embodiment, the body region comprises a buffer layer, wherein the buffer layer comprises one of gallium nitride (GaN), aluminum nitride (AlN), aluminum gallium nitride (AlGaN), or gallium and indium nitride (InGaN) with a thickness in the range of 100 nm to 2000 nm.

In an embodiment, the body region further comprises a channel layer disposed over the buffer layer, wherein the channel layer comprises gallium nitride (GaN) with a thickness in the range of 10 nm to 300 nm.

In an embodiment, the body region further comprises a barrier layer disposed over the channel layer, wherein the barrier layer comprises various compositions of aluminum gallium nitride with a thickness in the range of 2 nm to 40 nm.

In an embodiment, the substrate comprises one of silicon, silicon carbide (SiC), or sapphire.

In another aspect, a method of fabricating a semiconductor structure is disclosed, the method comprising providing a substrate, depositing a body region over the substrate, wherein the body region comprises a top surface. A source ohmic contact is disposed over a first portion of the top surface and extends into the body region from the top surface, a drain ohmic contact is disposed over a second portion of the top surface and extends into the body region from the top surface, and a floating ohmic contact is disposed over a third portion of the top surface between the source ohmic contact and the drain ohmic contact and extends into the body region from the top surface. The method further comprises disposing a first dielectric layer over an outermost surface of body region and depositing a first gate electrode and a second gate electrode in and around a first opening and a second opening, respectively, in the first dielectric layer over a top surface of the body region and over opposite sides of the floating ohmic contact.

In an embodiment, at least a second dielectric layer is disposed over exposed portions of a top surface the first dielectric layer and covering surfaces of the first gate electrode and the second gate electrode, and a field plate is coupled to the source ohmic contact and deposited over the second dielectric layer to cover at least the first gate electrode and the second gate electrode.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
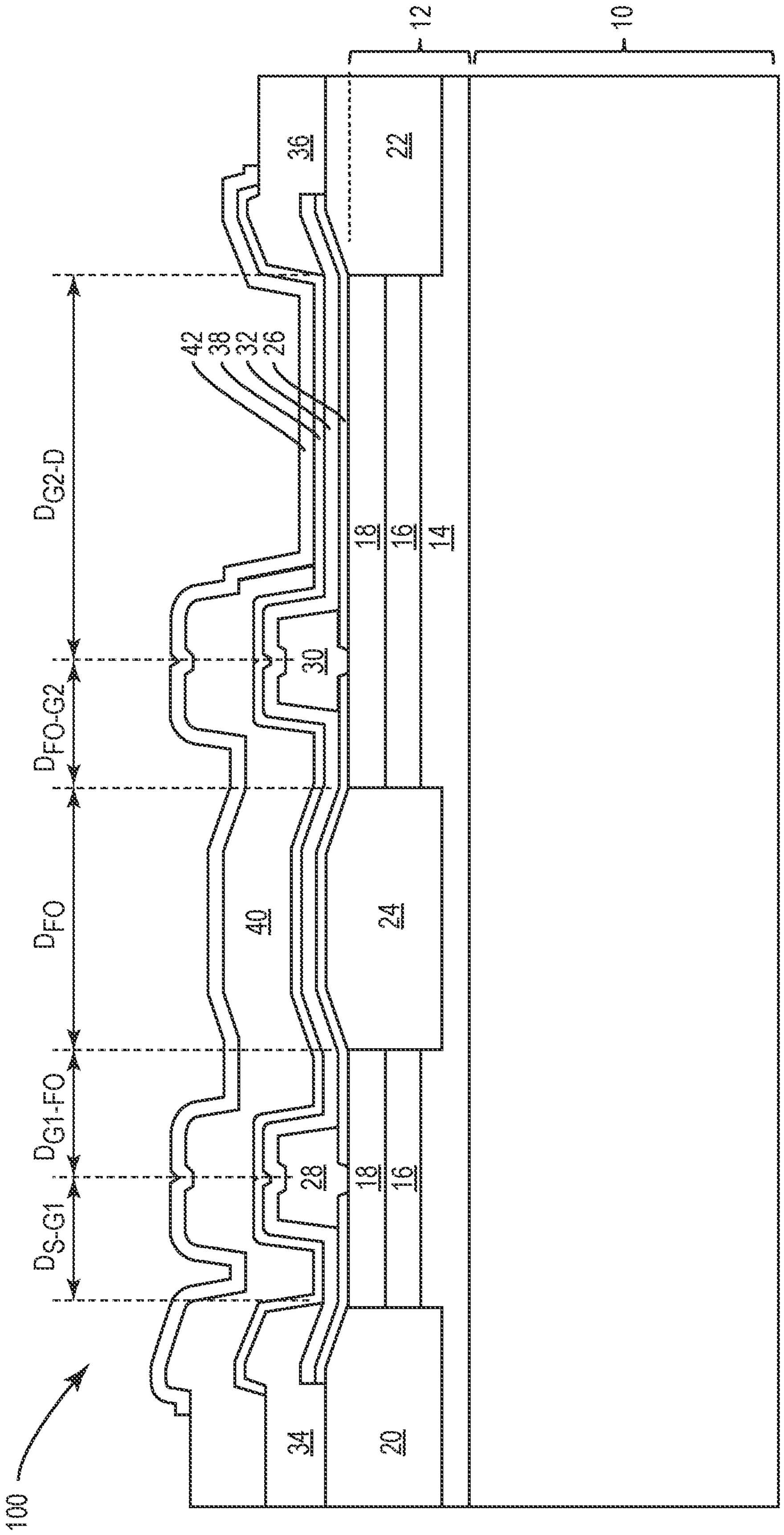
FIG. 1 shows a cross-sectional view of a quasi-dual-gate field-effect transistor (FET) structure having a floating ohmic contact and a field plate according to an embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 shows a cross-sectional view of an exemplary quasi-dual-gate field-effect transistor (FET) structure 100 having a floating ohmic contact 24 and a field plate 40. The quasi-dual-gate FET structure 100 may be a high-electron-mobility transistor (HEMT), for example, a quasi-dual-gate HEMT, comprising a substrate 10 and a body region 12 and configured to implement a cascade function. The body region 12 is disposed over a top surface of the substrate 10 and comprises a buffer layer 14, a channel layer 16, and a barrier layer 18, wherein the barrier layer 18 extends over the channel layer 16, and the channel layer 16 is disposed over the buffer layer 14. In this manner, a top surface of the barrier layer 18 forms a top surface of the body region 12 and a bottom surface of the buffer layer 14 forms a bottom surface of the body region 12.

The quasi-dual-gate FET structure 100 further comprises a source ohmic contact 20, a drain ohmic contact 22, and a floating ohmic contact 24 that form over the top surface of the body region 12 and diffuse downward into the body region 12 by thermal annealing. Next, a first passivation layer 26 is deposited over an outermost surface of the body region 12, including top surfaces of the body region 12, the source ohmic contact 20, the drain ohmic contact 22, and the floating ohmic contact 24. Portions of the first passivation layer 26 are selectively removed, for example, using photolithography, to form contact surfaces into which a first gate electrode 28, a second gate electrode 30, a source electrode 34, and a drain electrode 36 are deposited. In this manner, the first gate electrode 28 and the second gate electrode 30 are formed in, over, and around selectively removed portions of the first passivation layer 26. In this configuration, the first gate electrode 28 forms between the source ohmic contact 20 and the floating ohmic contact 24, and the second gate electrode 30 forms between the floating ohmic contact 24 and the drain ohmic contact 22.

The quasi-dual-gate FET structure 100, as shown in FIG. 1, may further comprise a second passivation layer 32 that is deposited over a top surface of the first passivation layer 26, exposed portions of top surfaces of the source ohmic contact 20 and the drain ohmic contact 22, and over exposed surfaces of the first gate electrode 28 and the second gate electrode 30. Upon selective removal of portions of the second passivation layer 32 over top surfaces of the source ohmic contact 20 and the drain ohmic contact 22, through a lift-off or an etching process, metal material is deposited in, over, and around selectively removed portions of the second passivation layer 32 to form the source electrode 34 and the drain electrode 36.

As illustrated, a distance between the source electrode 34 and the first gate electrode 28 (Os-G1) is measured horizontally, at least in this example, from an outer edge of the source electrode 34 to a middle point of the first gate electrode 28. In this regard, the distance between the source electrode 34 and the first gate electrode 28 (Os-G1) may be in the range of 0.2 μm to 2 μm, 0.5 μm to 1.5 μm, or 0.7 μm to 1 μm.

Furthermore, a distance between the first gate electrode 28 and the floating ohmic contact 24 (OG1-rn) is measured, horizontally, from the middle point of the first gate electrode 28 to an outer edge of the floating ohmic contact 24 over the top surface of the body region 12 that is closest to the first gate electrode 28. In this regard, the distance between the first gate electrode 28 and the floating ohmic contact 24 (OG1-rn) may be in the range of 1 μm to 6 μm, 1 μm to 4.5 μm, or 1 μm to 3 μm.

As shown in FIG. 1, the length of the floating ohmic contact 24 (Orn) is considered to be a distance between a first edge and a second edge of the floating ohmic contact 24. Accordingly, the length of the floating ohmic contact 24 (Orn) may be in the range of 1 μm to 12 μm, 3 μm to 8 μm, or 3 μm to 6 μm.

As with the distance between the first gate electrode 28 and the floating ohmic contact 24 (OG1-rn), a distance between the floating ohmic contact 24 and the second gate electrode 30 (Orn-G2) is measured, horizontally, from an outer edge of the floating ohmic contact 24, closest to the second gate electrode 30, to the middle point of the second gate electrode 30 over the top surface of the body region 12. In this regard, the distance between the floating ohmic contact 24 and the second gate electrode 30 (Orn-G2) may have a minimum value of 0.2 μm to 2 μm, 0.5 μm to 1.5 μm, or 0.7 μm to 1 μm. Lastly, a distance between the second gate electrode 30 and the drain electrode 36 (DG2-0) is measured horizontally, at least in this example, from a middle point of the second gate electrode 30 to an outer edge of the drain electrode 36, which may be in the range of 1 μm to 6 μm, 1 μm to 4.5 μm, or 1 μm to 3 μm.

Figure 2:
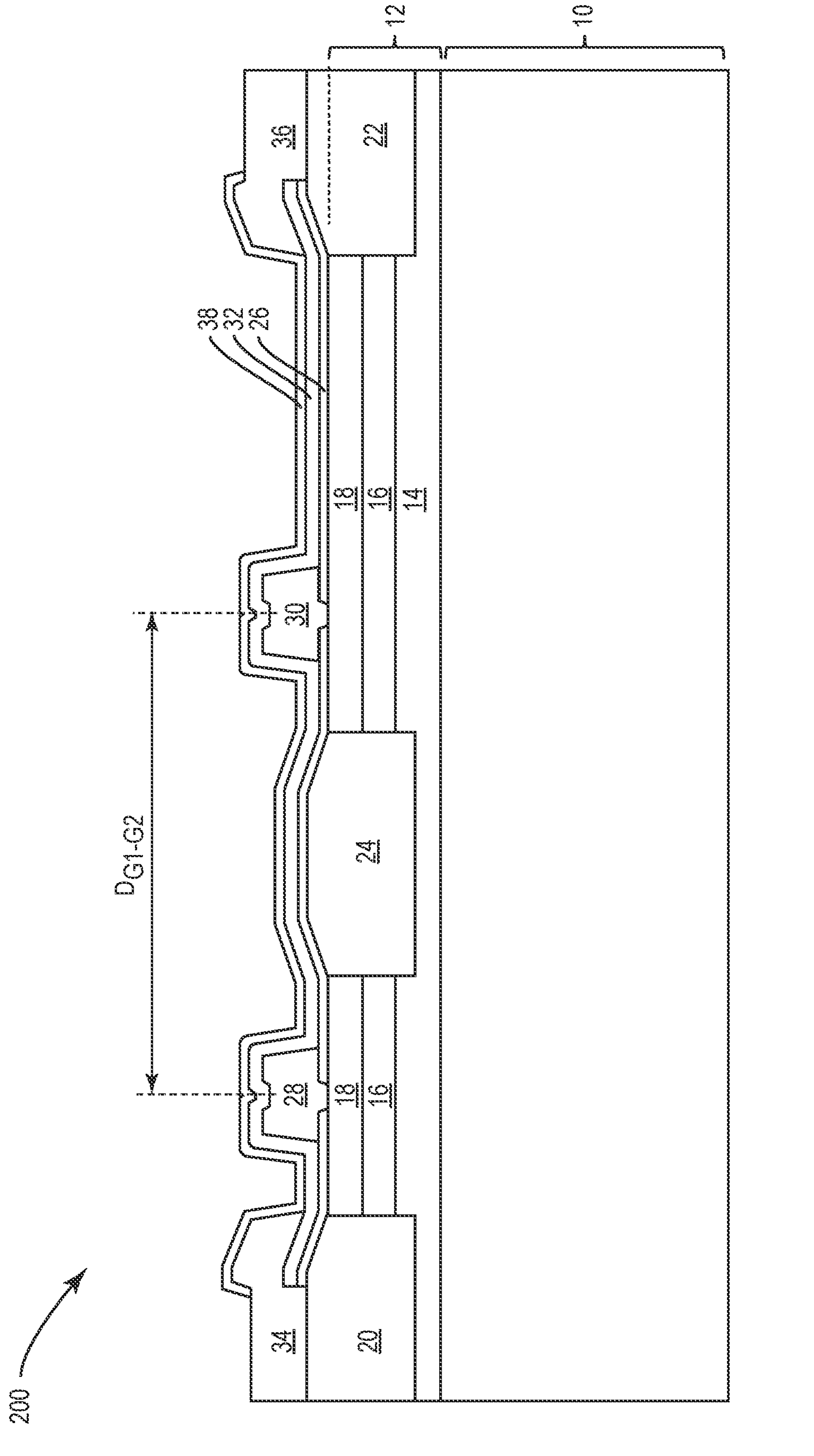
FIG. 2 shows a cross-sectional view of a quasi-dual-gate FET structure having a floating ohmic contact according to an embodiment of the present disclosure.

In this manner, a distance between the first gate electrode 28 and the second gate electrode 30 (DG1-G2), as shown in FIG. 2, is measured horizontally from the middle point of the first gate electrode 28 to the middle point of the second gate electrode 30, which equals the sum of the distance between the first gate electrode 28 and the floating ohmic contact 24 (DG1-rn), the length of the floating ohmic contact 24 (Orn), and the distance between the floating ohmic contact 24 and the second gate electrode 30 (Drn-G2). In this regard, the distance between the first gate electrode 28 and the second gate electrode 30 (DG1-G2) is in the range of 2 μm to 15 μm, 3 μm to 8 μm, or 4 μm to 6 μm.

The introduction of the floating ohmic contact 24 between the first gate electrode 28 and the second gate electrode 30 is particularly advantageous. The floating ohmic contact 24 eliminates resistive losses between the first gate electrode 28 and the second gate electrode 30 through establishing a conductive path between a first two-dimensional electron gas (2DEG) or a first channel (not shown) formed under the first gate electrode 28 and a second 2DEG or a second channel (not shown) formed under second gate electrode 30. In this manner, any limitation for a minimum distance required between the first gate electrode 28 and the second gate electrode 30 is eliminated without any reduction in peak performance capability due to an increased distance between the first gate electrode 28 and the second gate electrode 30.

Therefore, the inclusion of the floating ohmic contact 24 in the body region 12 and between the first gate electrode 28 and the second gate electrode 30 enables the distance between the first gate electrode 28 and the second gate electrode 30 (DG1-G2) to be increased while maintaining peak device performance capabilities. Increasing the distance between the first gate electrode 28 and the second gate electrode 30 (DG1-G2) is particularly advantageous in that it allows for an improved thermal isolation between channels (not shown) formed under the first gate electrode 28 and the second gate electrode 30. Furthermore, increasing DG1-G2 enables a heat generated in the body region 12 to be dissipated at an increased rate due to a thermal conduction path with higher thermal conductivity offered by the floating ohmic contact 24, which further enables reducing a die area used for a fabrication of the quasi-dual-gate FET structure 100.

Returning to FIG. 1, the quasi-dual-gate FET structure 100 may further comprise a third passivation layer 38 that is deposited over exposed surfaces of the second passivation layer 32 and at least partially over surfaces of the source electrode 34 and the drain electrode 36 such that a top surface of the source electrode 34 and a top surface of the drain electrode 36 remain exposed. In an embodiment, the quasi-dual-gate FET structure 100 comprises a field plate 40 that connects to the top surface of the source electrode 34, is disposed on and extends over exposed surfaces of the third passivation layer 38 such that the first gate electrode 28 and the second gate electrode 30 are covered underneath the field plate 40. In this manner a single conductive path is formed to connect to and extend from the source electrode 34, such that the first gate electrode 28 and the second gate electrode 30 are covered and encapsulated by the field plate 40, in addition to the second passivation layer 32 and the third passivation layer 38.

The implementation of the field plate 40 over the channel is advantageous in that it reduces the electric field, particularly in areas above the first gate electrode 28 and the second gate electrode 30, which enhances a breakdown voltage associated with the quasi-dual-gate FET structure 100 performing a cascade function. In this regard, the electric field between each of the first gate electrode 28 and the source ohmic contact 20, the first gate electrode 28 and the floating ohmic contact 24, the second gate electrode 30 and the floating ohmic contact 24, and the second gate electrode 30 and the drain ohmic contact 22 is spread out by the field plate 40.

The quasi-dual-gate FET structure 100, as shown in FIG. 1, further comprises a fourth passivation layer 42 that is deposited over a top surface of the field plate 40 and over exposed portions of the top surface of the third passivation layer 38 such that a top surface of the field plate 40 above the source electrode 34 and the top surface of the drain electrode 36 remain exposed.

It is to be understood that while the quasi-dual-gate FET structure 100 as shown in FIG. 1 and as described herein pertains to a HEMT semiconductor device, the scope of the present disclosure is not so limited. In this regard, features of the present disclosure may be utilized using other three-terminal active devices, for example, other types of FET semiconductor devices, including but not limited to, metal oxide semiconductor field-effect transistors (MOSFETs), metal insulator field-effect transistors (MISFETs), metal semiconductor field-effect transistor (MESFETs), junction field-effect transistor (JFETs), insulated-gate bipolar transistors (IGBTs), or the like.

FIG. 2 shows a cross-sectional view of a quasi-dual-gate FET structure 200 having a floating ohmic contact 24 according to an embodiment of the present disclosure. The quasi-dual-gate FET structure 200 is substantially similar to the quasi-dual-gate FET structure 100, as shown in FIG. 1, but with the field plate 40 and the fourth passivation layer 42 removed. In this regard, elements as shown in FIG. 2 with respect to the quasi-dual-gate FET structure 200 that were previously described in reference to FIG. 1 will continue to have the same reference numerals. For brevity, a detailed description of these components is omitted.

As shown in FIG. 2, resistive losses between a first channel (not shown) formed under the first gate electrode 28 and a second channel (not shown) formed under the second gate electrode 30 are eliminated through the introduction of the floating ohmic contact 24. Since resistive losses may contribute to reducing peak performance capability of the quasi-dual-gate FET structure 200 as a single-stage cascade, utilization of an ohmic contact such as the floating ohmic contact 24 in the body region 12 between the first gate electrode 28 and the second gate electrode 30 is advantageous.

In this manner, the floating ohmic contact 24 allows a greater separation distance between the first gate electrode 28 and the second gate electrode 30 without affecting the peak performance capability of the quasi-dual-gate FET structure 200. The greater separation distance between the first gate electrode 28 and the second gate electrode 30 enables a heat generated in the body region 12 to dissipate at a faster rate to improve cooling of the quasi-dual-gate FET structure 200 such that overheating is prevented. In addition, the greater separation distance between the first gate electrode 28 and the second gate electrode 30 made possible through the incorporation of the floating ohmic contact 24 provides a greater flexibility in fabrication of the quasi-dual-gate FET structure 200 through, for example, a flexibility in implementation of interconnects.

FIGS. 3A to 3H illustrate cross-sectional views of the quasi-dual-gate FET structure 300, depicted in successive stages of fabrication, according to an embodiment of the present disclosure, the quasi-dual-gate FET structure 100 of FIG. 1. Elements as shown in FIG. 3A to 3H with respect to the quasi-dual-gate FET structure 100 that were previously described in reference to FIG. 1 will continue to have the same reference numerals. Furthermore, a detailed description of these elements will be omitted for the sake of brevity.

Figure 3A:
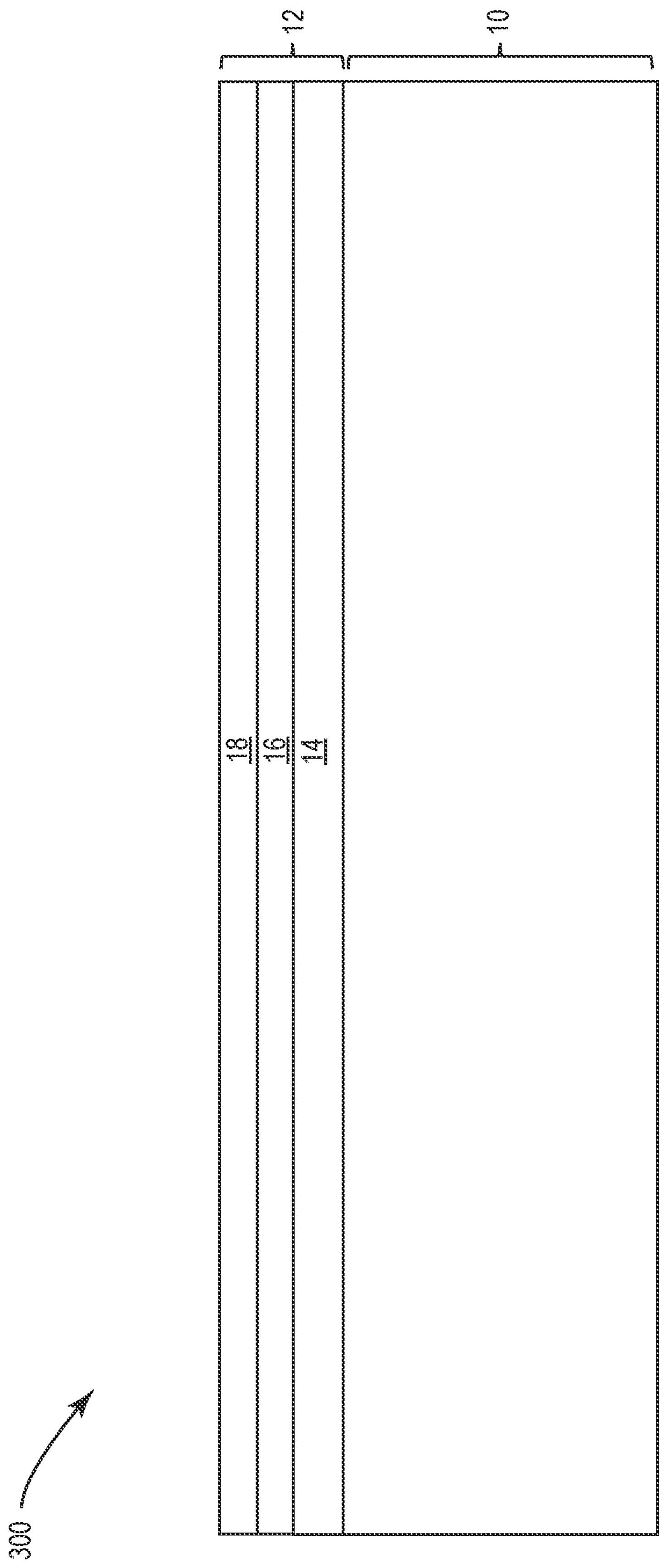
FIG. 3A to 3I show fabrication steps of the quasi-dual-gate FET structure of FIG. 1.

Referring now to FIG. 3A, a body region 12 comprising a buffer layer 14, a channel layer 16, and a barrier layer 18 is disposed over a top surface of a substrate 10. In this regard, the barrier layer 18 extends over the channel layer 16, and the channel layer 16 is disposed over the buffer layer 14 such that a bottom surface of the buffer layer 14 forms a bottom surface of the body region 12 and a top surface of the barrier layer 18 forms a top surface of the body region 12. The substrate 10 may be a bulk semiconductor substrate or a composite substrate formed of different materials. The substrate 10 comprises one of silicon (Si), silicon carbide (SiC), or sapphire (Al2O3) having a thickness in the range of 10 μm to 300 μm, 50 μm to 250 μm, or 100 μm to 200 μm.

Generally, the buffer layer 14 comprises one of gallium nitride (GaN), indium gallium nitride (InGaN), or aluminum gallium nitride (AlGaN) having a thickness in the range of 100 nm to 2000 nm. which may be deposited using a metal-organic chemical vapor deposition method. The channel layer 16 comprises GaN having a thickness in the range of 10 nm to 300 nm. The barrier layer 18 may comprise aluminum nitride (AlN), AlGaN, or alloys of gallium nitride, for example, AlxGa1−x N, InxGa1−xN, or aluminum indium gallium nitride (AlInGaN). The barrier layer 18 may have a thickness in the range of 2 nm to 40 nm, 5 nm to 35 nm, or 10 nm to 30 nm.

Figure 3B:
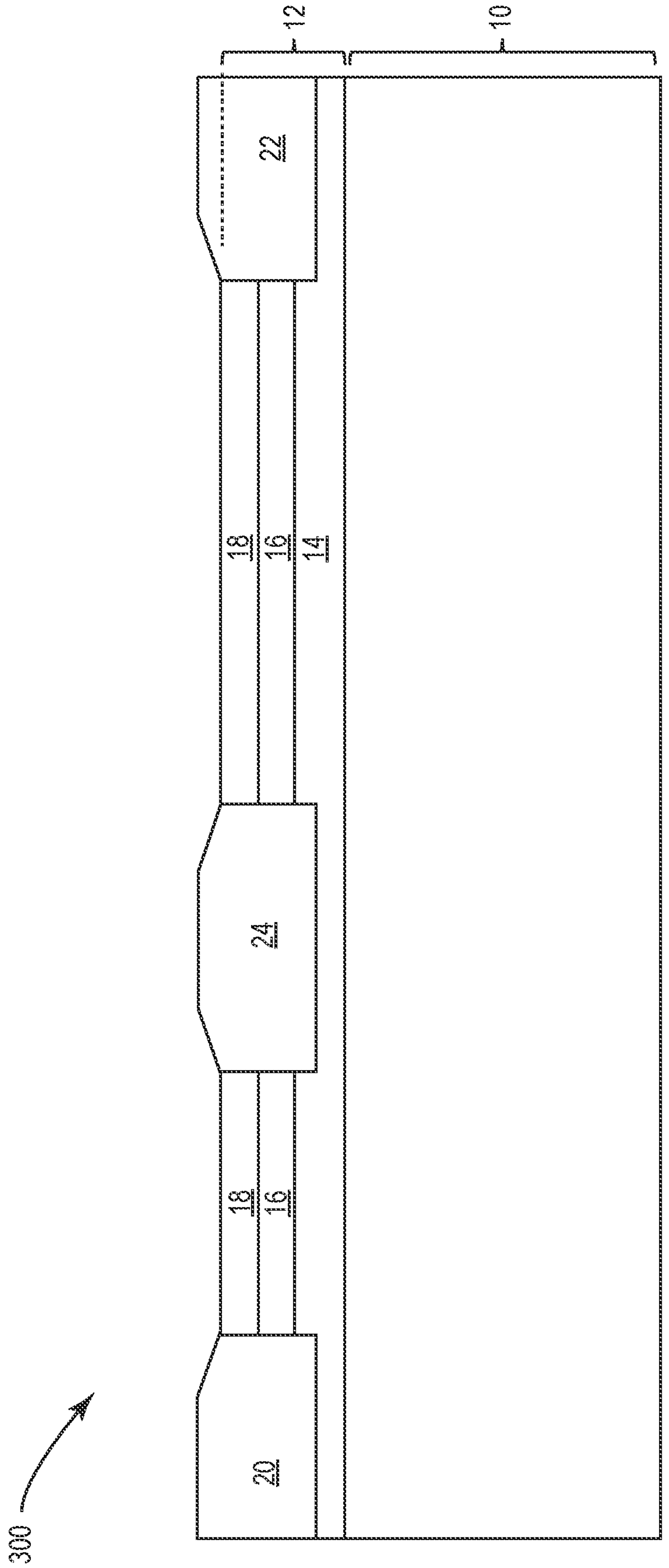

FIG. 3B illustrates the formation of the source ohmic contact 20, the drain ohmic contact 22, and the floating ohmic contact 24. The source ohmic contact 20, the drain ohmic contact 22, and the floating ohmic contact 24 can be made of different materials including but not limited to alloys of titanium, aluminum, gold, or nickel. Conventional photolithography or other suitable lithography methods may be used to define patterns in a photoresist layer or a resist mask (not shown) wherein metal material for the source ohmic contact 20, the drain ohmic contact 22, and the floating ohmic contact 24 is deposited. In this manner, one or more metal stacks (not shown) are deposited in defined areas over predefined areas over the top surface of the body region 12. Upon removal of the photoresist layer or the resist mask, deposited metal stacks are annealed, for example, using a rapid thermal annealing process, such that portions of metal stacks diffuse into the body region 12. In this manner, a first portion of the channel layer 16 and a first portion of the barrier layer 18 are between the source ohmic contact 20 and the floating ohmic contact 24. A second portion of the channel layer 16 and a second portion of the barrier layer 18 are between the drain ohmic contact 22 and the floating ohmic contact 24.

In application, rapid thermal annealing requires a temperature in the range of 600 cc to 900 cc, 650 cc to 850 cc, or 700 cc to 800 cc in order for metal stacks to diffuse into the body region 12 to form the source ohmic contact 20, the drain ohmic contact 22, and the floating ohmic contact 24. In this manner, a source electrode 34 and a drain electrode 36 (as shown in FIG. 3F) can form contact with top surfaces of the source ohmic contact 20 and the drain ohmic contact 22, respectively, while extending through at least the barrier layer 18 and the channel layer 16 in the body region 12.

In this regard, each of the source ohmic contact 20, the drain ohmic contact 22, and the floating ohmic contact 24 may have a thickness in the range of 50 nm to 300 nm, 100 nm to 300 nm, or 200 nm to 300 nm. In an embodiment, portions of metal stacks forming the source ohmic contact 20, the drain ohmic contact 22 and the floating ohmic contact 24 may remain over the top surface of the body region 12. In certain embodiments, a subsequent etching step may be used to partially, or in whole, remove remaining portions of metal stacks over the top surface of the body region 12.

In an alternative embodiment, a blanket metal deposition followed by etching of the metal blanket using a metal mask (not shown) forms the one or more metal stacks over predetermined areas over the top surface of the body region 12. Upon removal of the metal mask, deposited metal stacks are annealed such that portions of each of the deposited metal stacks is diffused into the body region 12 to form the source ohmic contact 20, the drain ohmic contact 22, and the floating ohmic contact 24. In yet another embodiment, the source ohmic contact 20, the drain ohmic contact 22, and the floating ohmic contact 24 may form through selective etching of the body region 12, including at least the barrier layer 18 and the channel layer 16, in areas over the top surface of the body region 12 wherein the source ohmic contact 20, the drain ohmic contact 22, and the floating ohmic contact 24 are to be formed. In this manner, a metal material is deposited, through sputtering or evaporation, to fill the selectively removed portions of the body region 12. A subsequent thermal annealing step enables a formation of the source ohmic contact 20, the drain ohmic contact 22, and the floating ohmic contact 24.

Figure 3C:
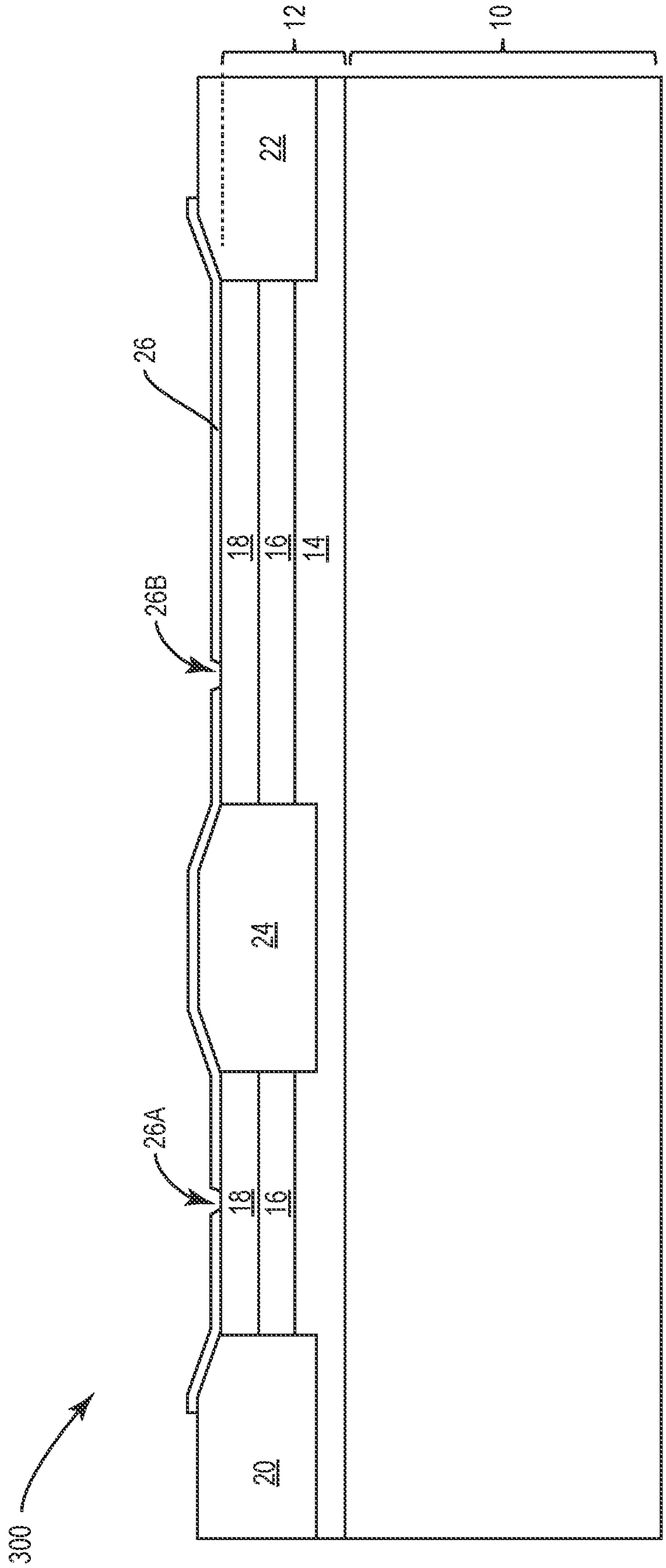

FIG. 3C illustrates the formation of a first passivation layer 26 over the top surface of the body region 12, a top surface of the floating ohmic contact 24, and top surfaces of the source ohmic contact 20 and the drain ohmic contact 22. The first passivation layer 26 comprises silicon nitride (SiN or $Si_3N_4$), silicon oxide ($SiO_2$), aluminum oxide ($Al_2O_3$), aluminum nitride (AlN), or the like, that is deposited through, for example, a chemical vapor deposition or an atomic layer deposition, having a thickness in the range of 200 nm to 1700 nm, 200 nm to 600 nm, 700 nm to 1100 nm, or 1300 nm to 1600 nm.

Figure 3D:
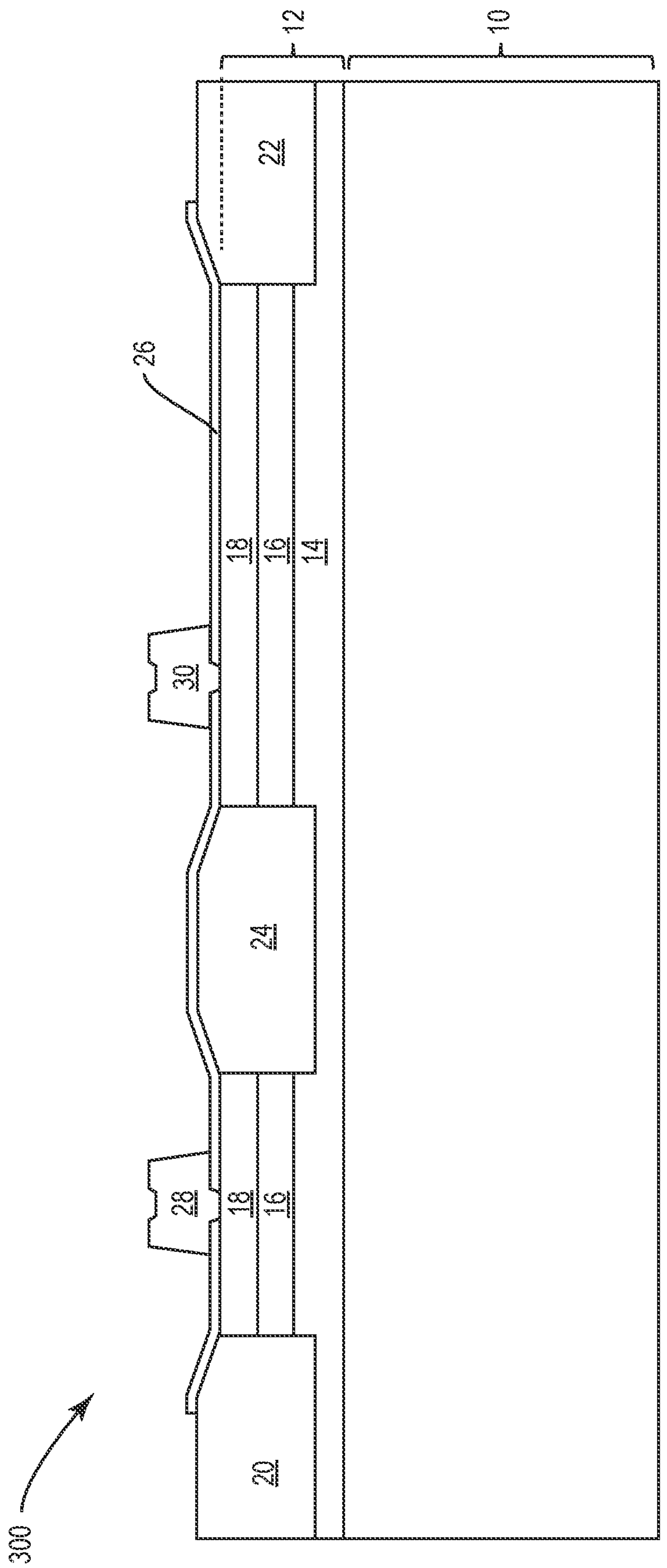

Once the first passivation layer 26 is deposited, an etching step may be performed such that predetermined portions of the first passivation layer 2 are removed. In this manner, portions of the first passivation layer 26 over top surfaces of the source ohmic contact 20 and the drain ohmic contact 22 are removed to provide openings for the source electrode 34 and the drain electrode 36 (as shown in FIG. 3F) to be deposited over and with direct contact to top surfaces of the source ohmic contact 20 and the drain ohmic contact 22. In addition, a first portion 26A of the first passivation layer 26 over the top surface of the body region 12 and between the source ohmic contact 20 and the floating ohmic contact 24 is removed to form an opening for the first gate electrode 28 (as shown in FIG. 3D) to be deposited. Similarly, a second portion 268 of the first passivation layer 26 over the top surface of the body region 12 and between the floating ohmic contact 24 and the drain ohmic contact 22 is removed to form an opening for the second gate electrode 30 (as shown in FIG. 3D) to be deposited.

FIG. 3D illustrates the formation of the first gate electrode 28 and the second gate electrode 30 according to an embodiment of the present disclosure. In this regard, metal material is deposited in, over, and around the first selectively removed portion 26A (as shown in FIG. 3C) of the first passivation layer 26 to form the first gate electrode 28 over the first portion of the channel layer 16 and the first portion of the barrier layer 18 between the source ohmic contact 20 and the floating ohmic contact 24. Similarly, metal material is deposited in, over, and around the second selectively removed portion 268 (as shown in FIG. 3C) of the first passivation layer 26 to form the second gate electrode 30 over the second portion of the channel layer 16 and the second portion of the barrier layer 18 between the drain ohmic contact 22 and the floating ohmic contact 24. Therefore, bottom surfaces of the first gate electrode 28 and the second gate electrode 30 are, at least partially, through the first selectively removed portion 26A and the second selectively removed portion 268 of the first passivation layer 26, in contact with top surfaces of the body region 12 and therefore the barrier layer 18.

The first gate electrode 28 and the second gate electrode 30 may comprise one of gold, nickel, nickel-chromium, platinum, titanium, chromium, alloys of titanium and tungsten, or platinum silicide. In this regard, each of the first gate electrode 28 and the second gate electrode 30 may have a thickness in the range of 50 nm to 500 nm, 100 nm to 450 nm, or 150 nm to 400 nm and a width in the range of 0.06 μm to 2 μm, 0.1 μm to 1 μm, or 0.15 μm to 0.5 μm. In an embodiment, a precursor metal layer (not shown) with a desired thickness is deposited over a top surface of the first passivation layer 26 including the first selectively removed portion 26A of the first passivation layer 26 and the second selectively removed portion 268 of the first passivation layer 26. In this regard, a resist mask (not shown) may be utilized to cover portions of a top surface of the precursor metal layer to define structures of the first gate electrode 28 and the second gate electrode 30. An etching step may be performed to remove uncovered portions of the precursor metal layer such that the first gate electrode and the second gate electrode 30 are formed with an intended shape, thickness, and width.

Figure 3E:
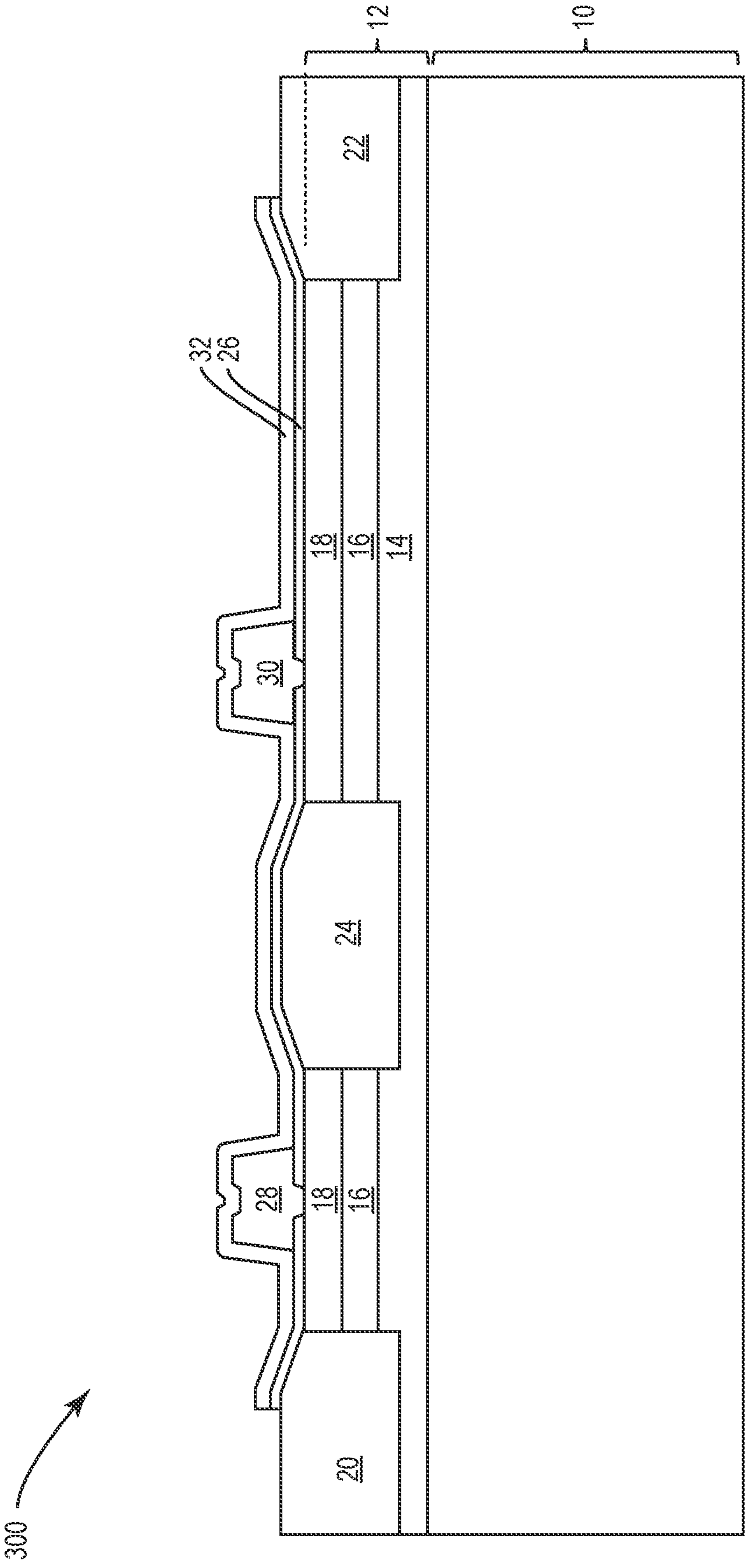
Figure 3F:
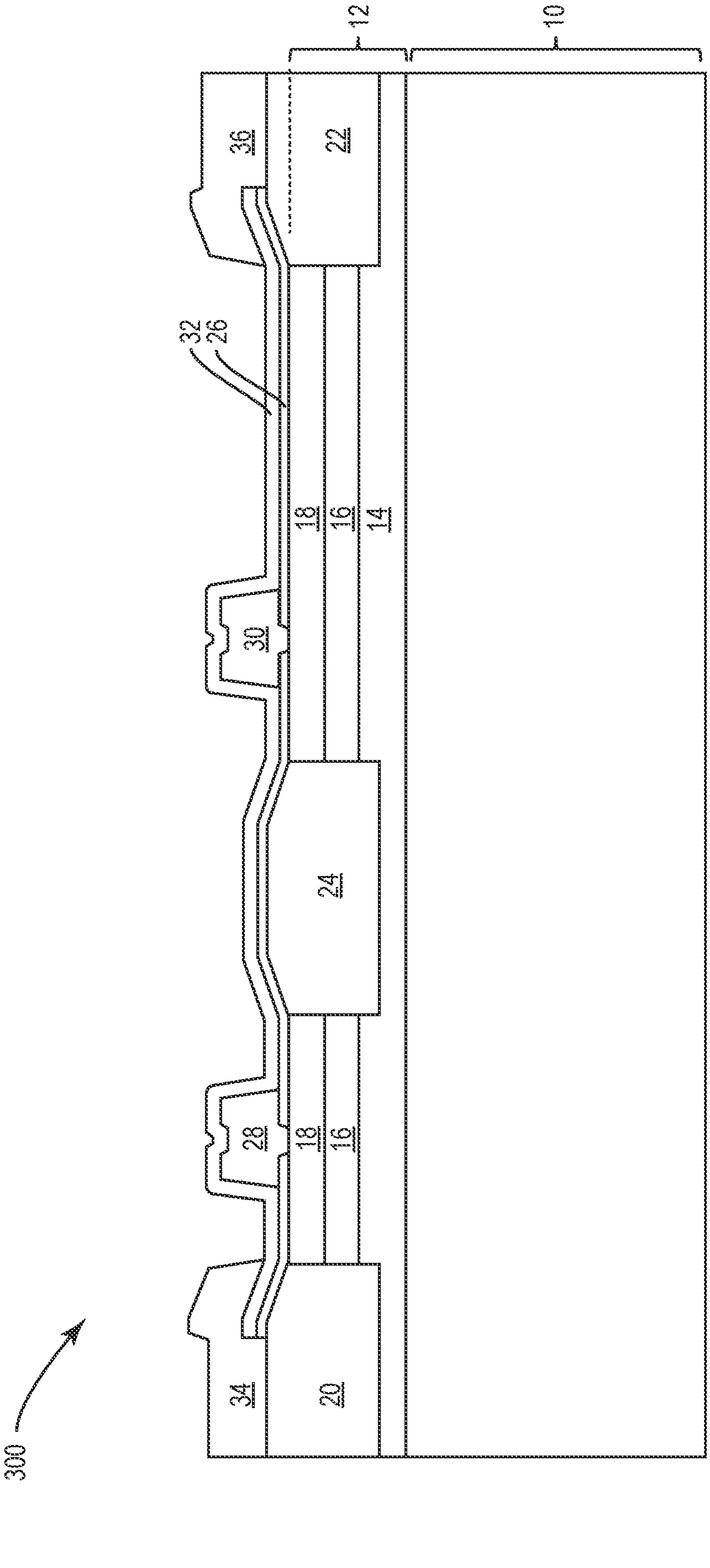

FIG. 3E shows the formation of the second passivation layer 32. In this regard, the second passivation layer 32 is deposited over a top surface of exposed portions of the first passivation layer 26, a top surface of an exposed portion of the source ohmic contact 20, a top surface of an exposed portion of the drain ohmic contact 22, and exposed outer surfaces of the first gate electrode 28 and the second gate electrode 30. In this manner, the first gate electrode 28 and the second gate electrode 30 are covered, encapsulated, and therefore electrically isolated using the second passivation layer 32.

The second passivation layer 32 is a dielectric and may comprise one of silicon nitride (SiN or $Si_3N_4$), silicon oxide ($SiO_2$), or the like. Upon formation of the second passivation layer 32, portions of the second passivation layer 32, including the top surface of the exposed portion of the source ohmic contact 20 and the top surface of the exposed portion of the drain ohmic contact 22, are removed such that the source electrode 34 and the drain electrode 36 are formed (as shown in FIG. 3F.)

FIG. 3F illustrates the formation of the source electrode 34 and the drain electrode 36. Metallization of the source electrode 34 and the drain electrode 36 is done through sputtering, evaporation, or other applicable methods of deposition of metal material over the top surface of the exposed portion of the source ohmic contact 20 and over a top surface of the second passivation layer 32 above and/or adjacent to the source ohmic contact 20, and over the top surface of the exposed portion of the drain ohmic contact 22 and over a top surface of the second passivation layer 32 above and/or adjacent to the drain ohmic contact 22.

In this regard, the source electrode 34 and the drain electrode 36 comprise metal material, including but not limited to titanium, aluminum, gold, or nickel or alloys thereof. In this manner, the first gate electrode 28 is located between the source electrode 34 and the floating ohmic contact 24, and the second gate electrode 30 is positioned between the floating ohmic contact 24 and the drain electrode 36.

Figure 3G:
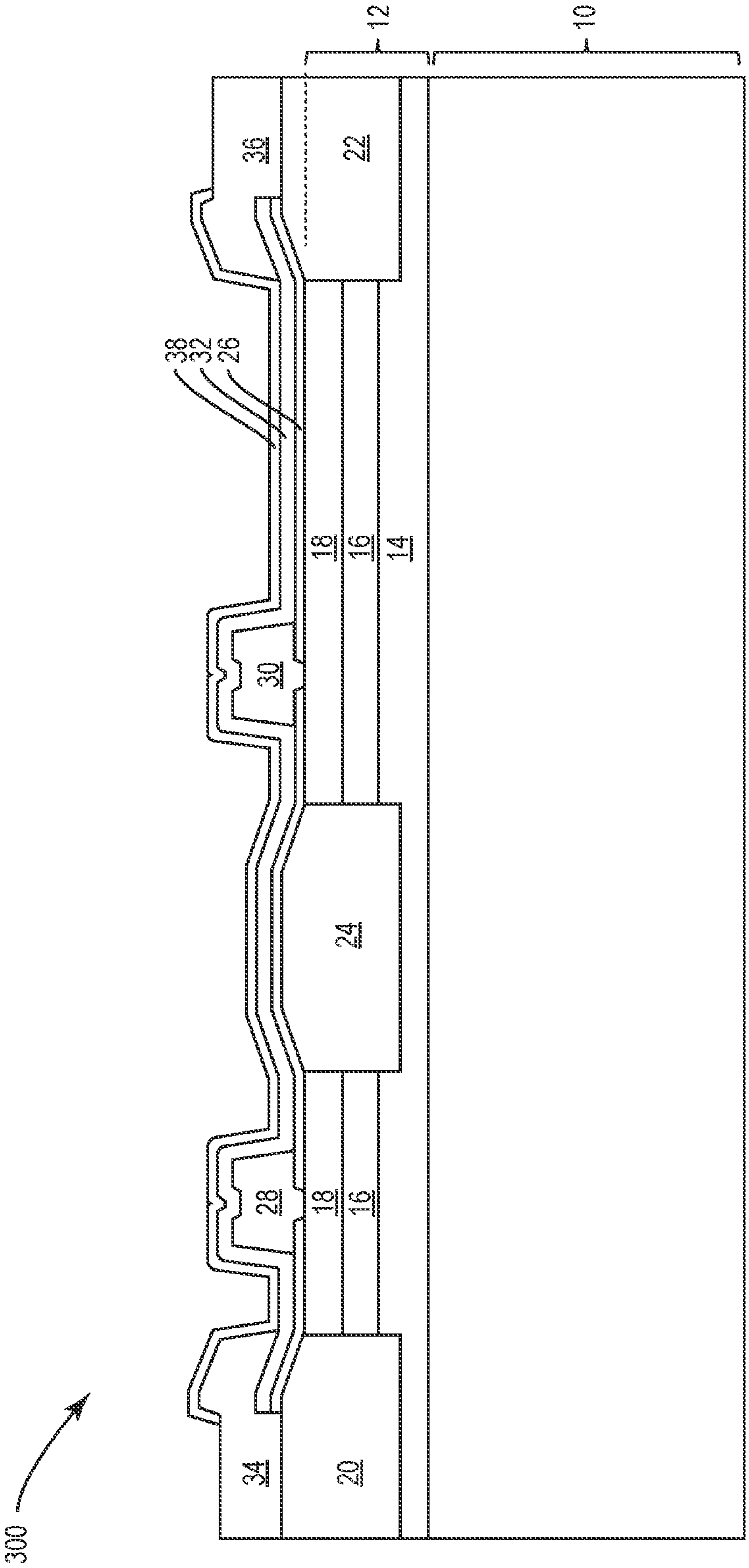

FIG. 3G illustrates the formation of the third passivation layer 38. The third passivation layer 38 may be deposited using chemical vapor deposition or other applicable methods over exposed surfaces of the second passivation layer 32 and over portions of surfaces of the source electrode 34 and the drain electrode 36 to form a continuous dielectric layer. In this manner, portions of top surfaces of the source electrode 34 and the drain electrode 36 remain exposed, enabling the source electrode 34 and the drain electrode 36 to be coupled, directly or indirectly, to other elements of the quasi-dual-gate FET structure 300 or other external circuit elements (not shown). The third passivation layer 38 may comprise silicon nitride (SiN or Si3N4), silicon oxide (SiO2), or the like.

Figure 3H:
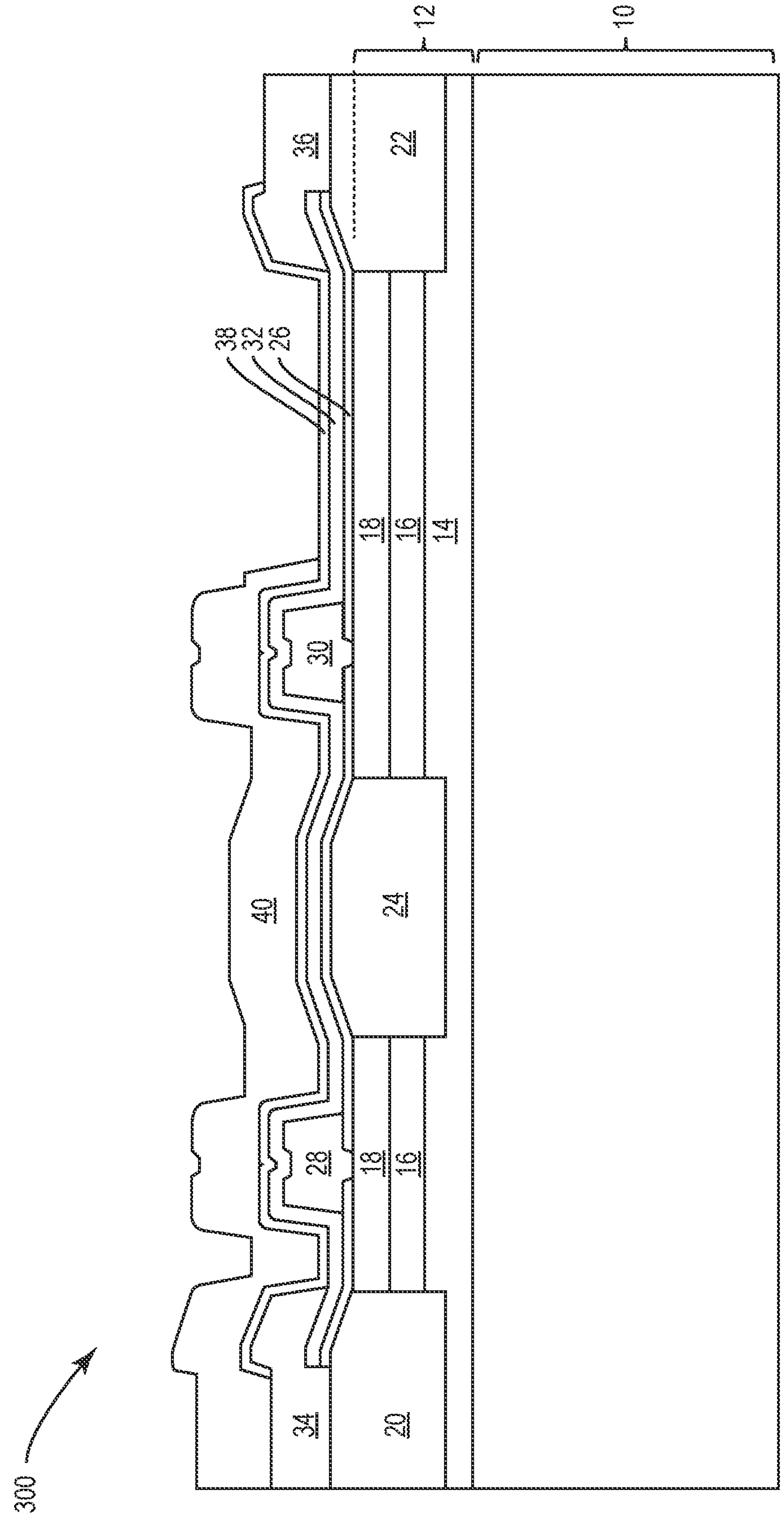
Figure 3I:
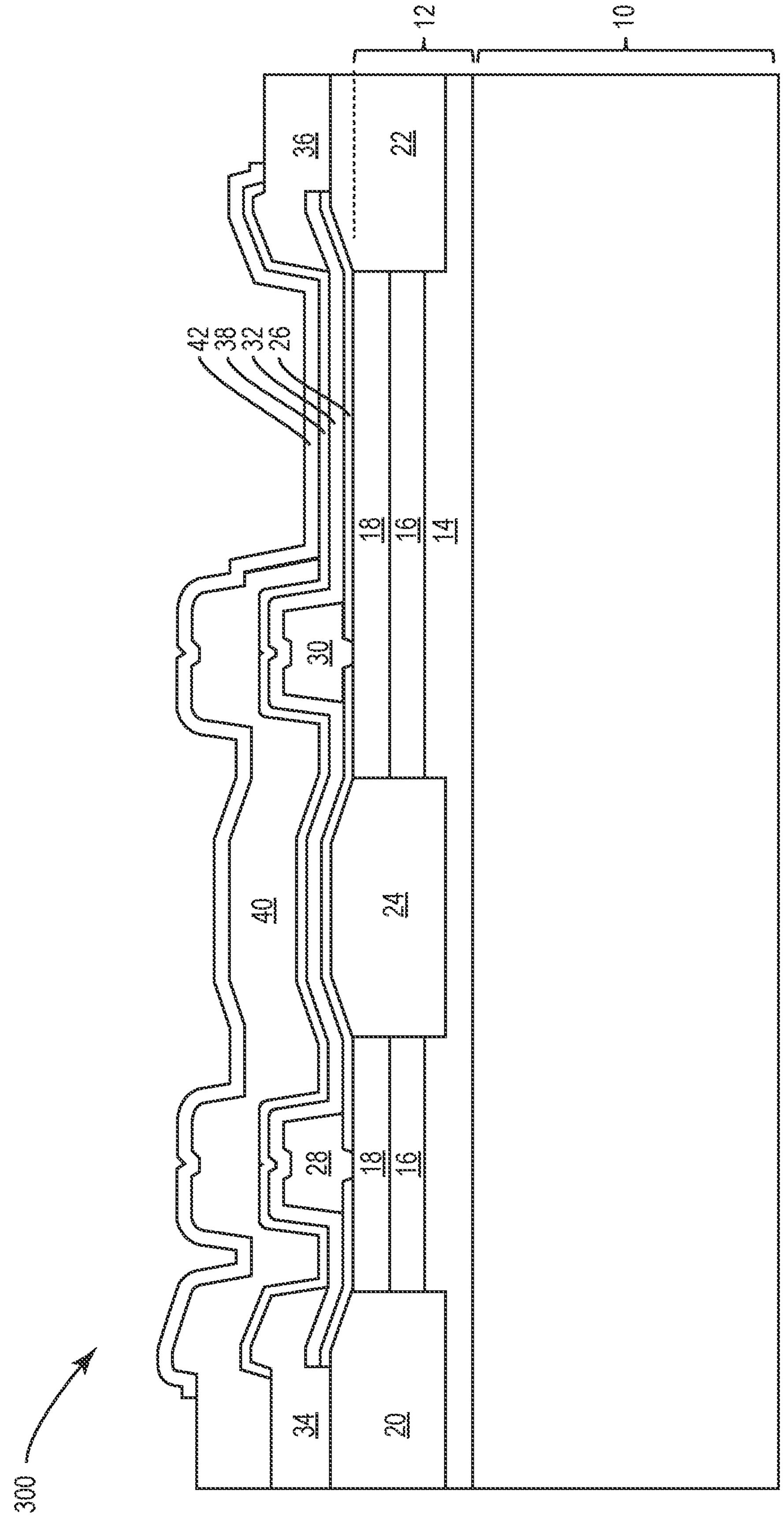

FIG. 3H illustrates the formation of the field plate 40. In an embodiment, the quasi-dual-gate FET structure 300 further comprises the field plate 40 that is disposed over and connects to the source electrode 34 and continues to extend over a top surface of the third passivation layer 38 until both the first gate electrode 28 and the second gate electrode 30 are covered. In this manner, the field plate 40 forms a continuous layer beneath which the first gate electrode 28 and the second gate electrode 30 are covered with the second passivation layer 32 and the third passivation layer 38. The field plate 40 may comprise a metal such as titanium (Ti), aluminum (Al), nickel (Ni), gold (Au), or the like, or their alloys and may have a thickness in the range of 50 nm to 2000 nm, 100 nm to 400 nm, 600 nm to 900 nm, 650 nm to 800 nm, or 150 nm to 300 nm and a length in the range of 0.5 μm to 2 μm, 0.7 μm to 1.5 μm, or 1 μm to 1.5 μm.

FIG. 31 illustrates the formation of the fourth passivation layer 42. The fourth passivation layer 42 is deposited over exposed surfaces of the field plate 40, exposed surfaces of the third passivation layer 38, and exposed portion of top surface of the drain electrode 36. Upon formation of the fourth passivation layer 42, portions of the fourth passivation layer 42, including a top surface of the source electrode 34 and a top surface of the drain electrode 36, are removed so as to enable the source electrode 34 and the drain electrode 36 to be coupled, directly or indirectly, to other elements of the quasi-dual-gate FET structure 300 or other external circuit elements (not shown).

The fourth passivation layer 42 is a dielectric and may comprise one of silicon nitride (SiN or Si3N4), silicon oxide (SiO2), or the like. In an embodiment, a protective overcoat (not shown) comprising Al2Q3 may be deposited over a top surface of the fourth passivation layer 42 using an atomic laser deposition method.

Figure 4:
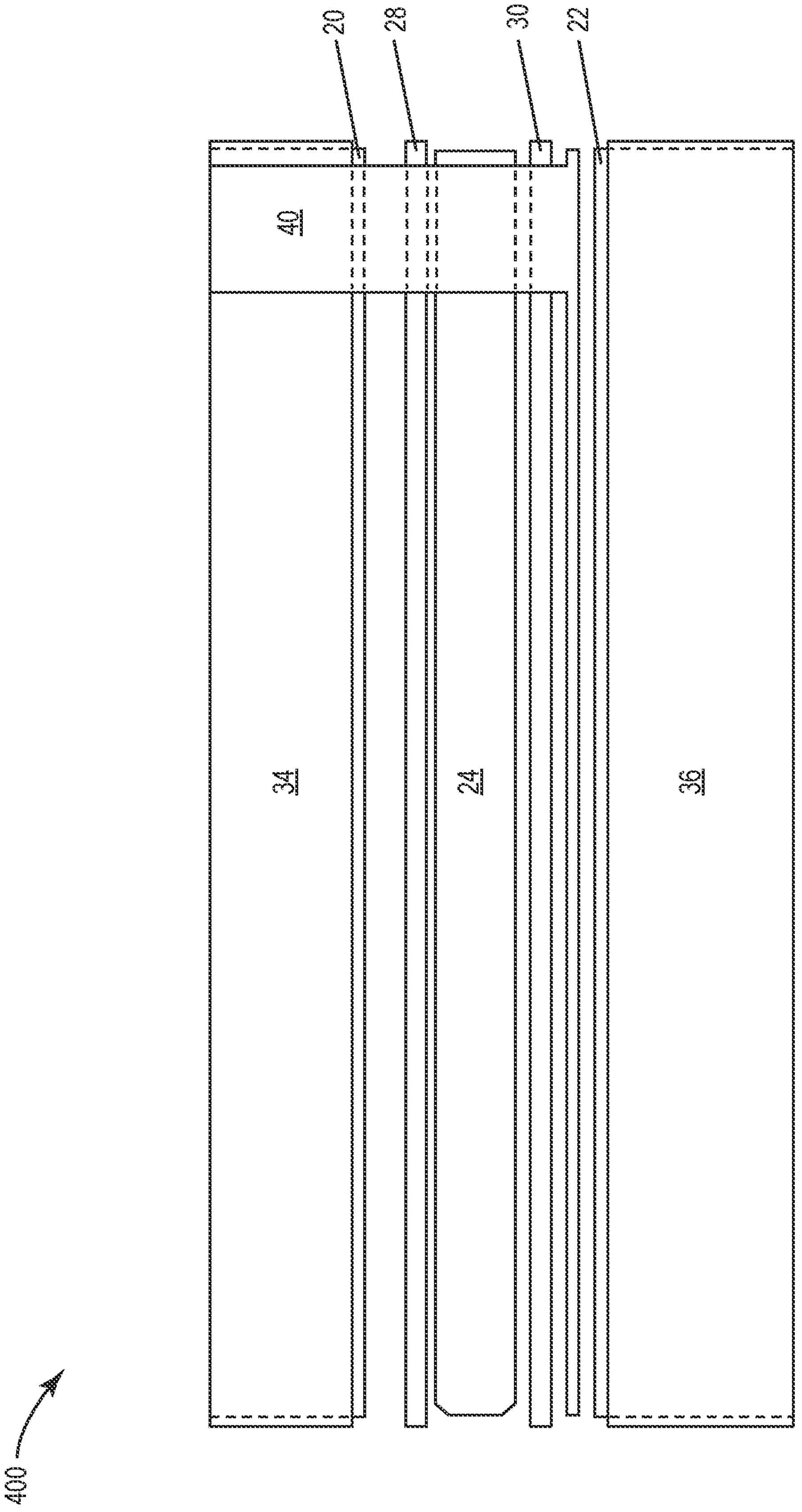
FIG. 4 shows an exemplary top view of a quasi-dual-gate FET structure.

FIG. 4 shows an exemplary top-view of a quasi-dual-gate FET structure 400. Elements as shown in FIG. 4 with respect to the quasi-dual-gate FET structure 400 that were previously described in reference to FIG. 1 with respect to the quasi-dual-gate FET structure 100 will continue to have the same reference numerals. Furthermore, a detailed description of these elements will be omitted for the sake of brevity.

Referring now to FIG. 4, the quasi-dual-gate FET structure 400 comprises a source electrode 34 disposed over a source ohmic contact 20 and a drain electrode 36 disposed over a drain ohmic contact 22. The quasi-dual-gate FET structure 400 further comprises a floating ohmic contact 24 located in between the source ohmic contact 20 and the drain ohmic contact 22, a first gate electrode 28 located in between the source ohmic contact 20 and the floating ohmic contact 24, and a second gate electrode 30 located in between the drain ohmic contact 22 and the floating ohmic contact 24.

A field plate 40 connects to a top surface of the source electrode 34, and extends over the first gate electrode 28, the floating ohmic contact 24, and the second gate electrode 30. It is important to note that for the purposes of simplicity of illustration, dielectric layers that form under the field plate 40 are not shown. Furthermore, in certain embodiments, the field plate 40 may entirely cover a top surface of the source electrode 34, the first gate electrode 28, the floating ohmic contact 24, the second gate electrode 30, and areas of a top surface of the body region 12 (not shown) that fall in between. A surface area of the field plate 40 and a thickness of dielectric layers formed underneath the field plate 40 play an important role in elimination and management of electric field formed around the first gate electrode 28, the floating ohmic contact 24, and the second gate electrode 30.

Figure 5:
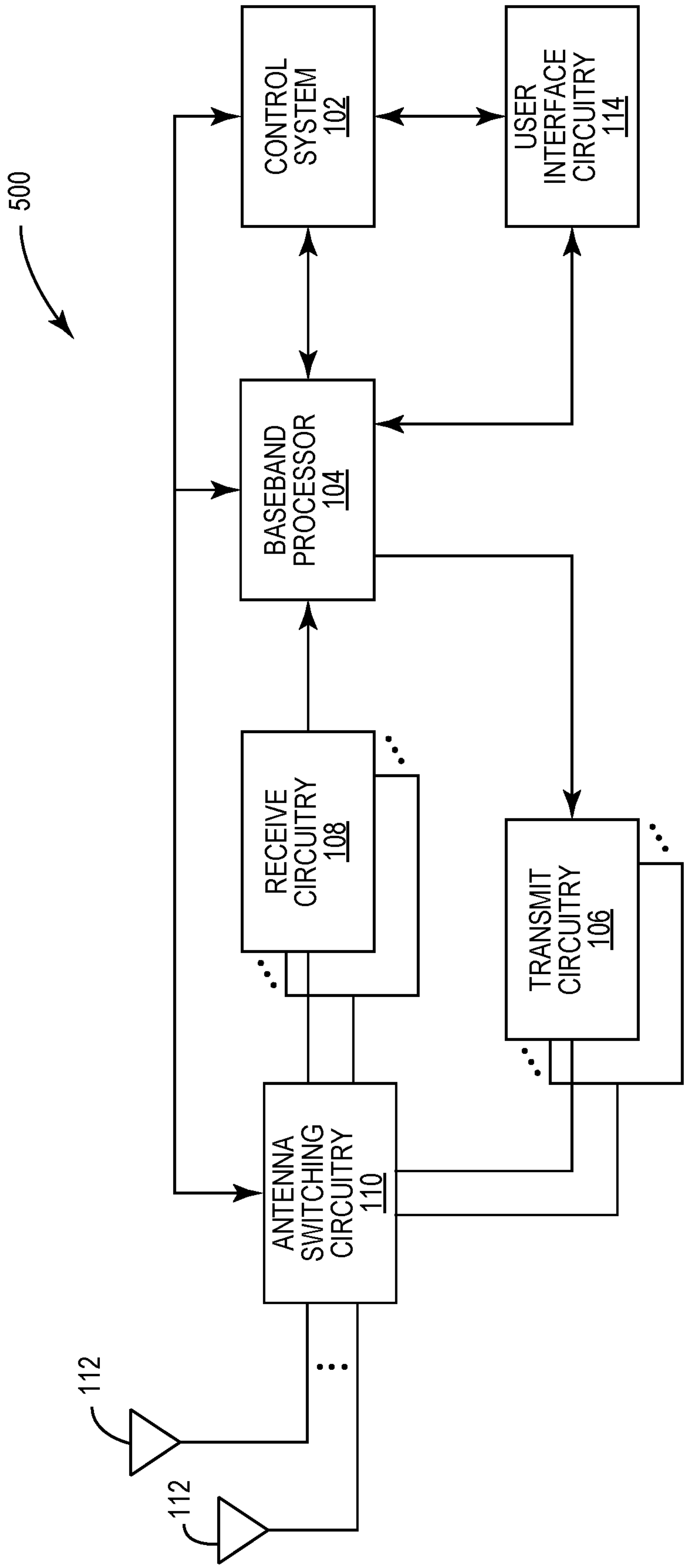
FIG. 5 illustrates the quasi-dual-gate FET structure as described herein implemented in various types of user elements.

With reference to FIG. 5, the concepts described above may be implemented in various types of user elements 500, such as mobile terminals, smart watches, tablets, computers, navigation devices, access points, and like wireless communication devices that support wireless communications, such as cellular, wireless local area network (WLAN), Bluetooth, and near-field communications. The user elements 500 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA) or an application-specific integrated circuit (ASIC). In this regard, the control system 102 can include one or more of at least a microprocessor, an embedded memory circuit, and a communication bus interface. The receive circuitry 108 receives radio frequency signals via the antennas 112 through the antenna switching circuitry 110 from one or more base stations. A low-noise amplifier and a filter of the receive circuitry 108 cooperate to amplify and remove broadband interference from the received signal for processing. Down conversion and digitization circuitry (not shown) then down convert the filtered, received signal to an intermediate or baseband frequency signal, which is then digitized into one or more digital streams using analog-to-digital converters.

The baseband processor 104 processes the digitized received signal to extract the information or data bits conveyed in the received signal. This processing typically comprises demodulation, decoding, and error correction operations, as will be discussed on greater detail below. The baseband processor 104 is generally implemented in one or more digital signal processors and application-specific integrated circuits.

For transmission, the baseband processor 104 receives digitized data, which may represent voice, data, or control information, from the control system 102, which it encodes for transmission. The encoded data is output to the transmit circuitry 106, where a digital-to-analog converter converts the digitally encoded data into an analog signal and a modulator modulates the analog signal onto a carrier signal that is at a desired transmit frequency or frequencies. A power amplifier amplifies the modulated carrier signal to a level appropriate for transmission and delivers the modulated carrier signal to the antennas 112 through the antenna switching circuitry 110. The multiple antennas 112 and the replicated transmit circuitry 106 and receive circuitry 108 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A dual-gate high electron mobility transistor, HEMT, comprising:

a substrate;

a body region over the substrate comprising:

a source ohmic contact, a floating ohmic contact between the source ohmic contact and a drain ohmic contact;

a barrier layer;

a channel layer; and a buffer layer;

wherein the barrier layer extends over the channel layer and the channel layer extends over the buffer layer; and wherein the source ohmic contact, the floating ohmic contact, and the drain ohmic contact extend into the barrier layer, the channel layer, and the buffer layer so that the barrier layer, the channel layer, and the buffer layer each have a first portion between the source ohmic contact and the floating ohmic contact and a second portion between the drain ohmic contact and the floating ohmic contact;

a first gate electrode over the first portion of the channel layer and between the source ohmic contact and the floating ohmic contact; and a second gate electrode over the second portion of the channel layer and between the drain ohmic contact and the floating ohmic contact.

2. The dual-gate HEMT of claim 1 further comprising a field plate extending over the floating ohmic contact, the first gate electrode, and the second gate electrode, wherein the field plate electrically couples to at least a portion of the source ohmic contact.

3. The dual-gate HEMT of claim 1 wherein each of the source ohmic contact, the drain ohmic contact, and the floating ohmic contact comprises one of titanium, aluminum, nickel, gold, or their composition.

4. The dual-gate HEMT of claim 1 wherein a thickness of the floating ohmic contact is in the range of 50 nm to 300 nm.

5. The dual-gate HEMT of claim 1 wherein a width of the floating ohmic contact is in the range of 1 μm to 12 μm.

6. The dual-gate HEMT of claim 1 wherein a distance between a central point of the first gate electrode and a central point of the second gate electrode is in the range of 2 μm to 15 μm.

7. The dual-gate HEMT of claim 1 wherein a distance between a central point of the first gate electrode to the floating ohmic contact is in the range of 0.2 μm to 5 μm.

8. The dual-gate HEMT of claim 1 wherein a distance between a central point of the second gate electrode to the floating ohmic contact is in the range of 0.2 μm to 5 μm.

9. The dual-gate HEMT of claim 1 wherein the body region further comprises a buffer layer such that the channel layer disposes over the buffer layer, the buffer layer comprising one of gallium nitride (GaN), aluminum nitride (AlN), aluminum gallium nitride (AlGaN), or gallium and indium nitride (InGaN) with a thickness in the range of 100 μm to 2000 μm.

10. The dual-gate HEMT of claim 1 wherein the channel layer comprises gallium nitride (GaN) with a thickness in the range of 10 nm to 300 nm.

11. The dual-gate HEMT of claim 1, wherein the barrier layer comprises various compositions of aluminum gallium nitride with a thickness in the range of 2 nm to 40 nm.

12. The dual-gate HEMT of claim 1 wherein the substrate comprises one of silicon, silicon carbide (SiC), or sapphire.

13. The dual-gate HEMT of claim 1 wherein the dual-gate HEMT is a gallium nitride-based dual-gate HEMT.

14. The dual-gate HEMT of claim 1 wherein a portion of the first gate electrode forms a contact with a top surface of the first portion of the barrier layer, and a portion of the second gate electrode forms contact with a top surface of the second portion of the barrier layer.

15. The dual-gate HEMT of claim 14 further comprising a first passivation layer disposed over a portion of top surfaces of the first and the second portion of the barrier layer, and at least partially over a top surface of the floating ohmic contact.

16. The dual-gate HEMT of claim 15 further comprising a second passivation layer disposed at least partially over a top surface of the first passivation layer and top and side surfaces of the first gate electrode and the second gate electrode.

17. The dual-gate HEMT of claim 16 further comprising a source electrode disposed over at least a portion of a top surface of the source ohmic contact and a drain electrode disposed over at least a portion of a top surface of the drain ohmic contact.

18. The dual-gate HEMT of claim 17 further comprising a third passivation layer disposed at least partially over a surface of the second passivation layer.

19. The dual-gate HEMT of claim 18 further comprising a field plate disposed over a portion of a surface of the third passivation layer above the floating ohmic contact, the first gate electrode, and the second gate electrode, wherein the field plate disposes over and electrically couples to a portion of a top surface of the source electrode.

20. A mobile terminal with power amplifier circuitry having a dual-gate HEMT, the dual-gate HEMT comprising:
- a substrate;
- a body region over the substrate comprising:
  - a source ohmic contact, a floating ohmic contact between the source ohmic contact and a drain ohmic contact;
  - a barrier layer;
  - a channel layer; and
  - a buffer layer;
  - wherein the barrier layer extends over the channel layer and the channel layer extends over the buffer layer; and
  - wherein the source ohmic contact, the floating ohmic contact, and the drain ohmic contact extend into the barrier layer, the channel layer, and the buffer layer so that the barrier layer, the channel layer, and the buffer layer each have a first portion between the source ohmic contact and the floating ohmic contact and a second portion between the drain ohmic contact and the floating ohmic contact;
- a first gate electrode over the first portion of the channel layer and between the source ohmic contact and the floating ohmic contact; and
- a second gate electrode over the second portion of the channel layer and between the drain ohmic contact and the floating ohmic contact.

21. A user device with power amplifier circuitry having a dual-gate HEMT, the dual-gate HEMT comprising:
- a substrate;
- a body region over the substrate comprising:
  - a source ohmic contact, a floating ohmic contact between the source ohmic contact and a drain ohmic contact;
  - a barrier layer;
  - a channel layer; and
  - a buffer layer;
  - wherein the barrier layer extends over the channel layer and the channel layer extends over the buffer layer; and
  - wherein the source ohmic contact, the floating ohmic contact, and the drain ohmic contact extend into the barrier layer, the channel layer, and the buffer layer so that the barrier layer, the channel layer, and the buffer layer each have having a first portion between the source ohmic contact and the floating ohmic contact and a second portion between the drain ohmic contact and the floating ohmic contact;
- a first gate electrode over the first portion of the channel layer and between the source ohmic contact and the floating ohmic contact; and
- a second gate electrode over the second portion of the channel layer and between the drain ohmic contact and the floating ohmic contact.

22. A method of fabricating a semiconductor structure, comprising:
- providing a substrate;
- providing a body region over the substrate, wherein:
  - a source ohmic contact, a drain ohmic contact, and a floating ohmic contact between the source ohmic contact and the drain ohmic contact are formed;
  - forming a barrier layer;
  - forming a channel layer; and
  - forming a buffer layer;
  - wherein the source ohmic contact, the floating ohmic contact, and the drain ohmic contact extend into the barrier layer, the channel layer, and the buffer layer so that the barrier layer, the channel layer, and the buffer layer each have a first portion between the source ohmic contact and the floating ohmic contact and a second portion between the drain ohmic contact and the floating ohmic contact;
- forming a first gate electrode over the first portion of the channel layer and between the source ohmic contact and the floating ohmic contact; and
- forming a second gate electrode over the second portion of the channel layer and between the drain ohmic contact and the floating ohmic contact.

* * * * *